(12) United States Patent
Chen et al.

(10) Patent No.: US 11,901,213 B2
(45) Date of Patent: Feb. 13, 2024

(54) CHIP TRANSFER DEVICE CAPABLE OF FLOATINGLY POSITIONING A CHIP AND METHOD FOR FLOATINGLY POSITIONING A CHIP

(71) Applicant: Chroma Ate Inc., Taoyuan (TW)

(72) Inventors: Chien-Ming Chen, Taoyuan (TW); Chin-Yi Ouyang, Taoyuan (TW)

(73) Assignee: CHROMA ATE INC., Taoyuan (TW)

( * ) Notice: Subject to any disclaimer, the term of this patent is extended or adjusted under 35 U.S.C. 154(b) by 234 days.

(21) Appl. No.: 17/521,952

(22) Filed: Nov. 9, 2021

(65) Prior Publication Data

US 2022/0157639 A1     May 19, 2022

(30) Foreign Application Priority Data

Nov. 18, 2020   (TW) .................................. 109140250

(51) Int. Cl.
*H01L 21/683* (2006.01)
*H01L 21/677* (2006.01)
*H01L 21/67* (2006.01)
*H01L 21/673* (2006.01)

(52) U.S. Cl.
CPC ........ *H01L 21/6838* (2013.01); *H01L 21/673* (2013.01); *H01L 21/67144* (2013.01); *H01L 21/67259* (2013.01); *H01L 21/67775* (2013.01)

(58) Field of Classification Search
None
See application file for complete search history.

(56) References Cited

U.S. PATENT DOCUMENTS 4,600,936 A * 7/1986 Khoury ............. H01L 21/67333
257/797

* cited by examiner

*Primary Examiner* — William R Harp
(74) *Attorney, Agent, or Firm* — McClure, Qualey & Rodack, LLP

(57) ABSTRACT

The present invention relates to a chip transfer device capable of floatingly positioning a chip and a method for floatingly positioning a chip. When a chip is placed in a chip socket, a control unit controls an air pressure switching valve to allow at least one vent hole to be communicated with a positive air pressure source. An air flow from the positive air pressure source blows a lower surface of the chip through the vent hole, so that the at least one chip is air-floated. Accordingly, when the chip socket is communicated with the positive air pressure source, the air flow blows the lower surface of the chip in the chip socket through the vent hole, so that the chip is air-floated in the chip socket to reduce the error displacement of the chip offset.

9 Claims, 6 Drawing Sheets

CHIP TRANSFER DEVICE CAPABLE OF FLOATINGLY POSITIONING A CHIP AND METHOD FOR FLOATINGLY POSITIONING A CHIP

FIELD OF THE INVENTION

The present invention relates to a chip transfer device capable of floatingly positioning a chip and a method for floatingly positioning a chip, in particular to a method for positioning a thin chip and a transfer device using the method.

DESCRIPTION OF THE RELATED ART

Positioning of an unpackaged chip (die) has always been one of the important problems for manufacturers of semiconductor manufacturing equipments or semiconductor testing equipments because the chip before being packaged is quite thin and light. If an improper force is exerted to the chip, it may be damaged easily and then discarded. Therefore, in either of a pick-and-place process or a transfer process, the chip may be not properly positioned due to the influence of external factors.

Reference is made to FIG. 1A which is a schematic view showing a conventional thin chip pick-and-place process. As an example, a chip C is being placed in a chip socket Sc. When a pick-and-place device P transfers the chip C to a position above the chip socket Sc, the pick-and-place device P would not directly press the chip C into the chip socket Sc. This is because the downward pressure of the pick-and-place device P may easily crush the chip C if the chip C is offset from the chip socket Sc. Therefore, the pick-and-place device P releases the chip C when the chip C is located above the chip socket Sc at a certain height H, so that the chip C drops into the chip socket Sc.

However, the chip C is extremely light and relatively thin, and, the air flow rate under the chip C is slow during dropping of the chip, so the pressure is relatively high. When the air flows around an external edge of the chip C, a vortex which causes an air pressure drop is generated. The vortex is generated at four edges of the chip C alternately, so that the four edges of the chip C are subjected to different pressure. This causes the chip C to be swung easily during dropping of the chip C, and it is difficult that the chip C exactly and correctly falls into the chip socket Sc.

In order to solve the above problem, the conventional art mostly starts with the design of the chip socket Sc, that is, the four upper edges of the chip socket Sc are provided with a chamfer Cf, so that the four edges of the chip C can slid along the chamfer Cf into the chip socket Sc during dropping of the chip C. In the case of a great offset, for example, the four edges of the chip C exceed the chamfer Cf of the chip socket Sc, the chamfer Cf is unable to assist the chip C to completely fall into the chip socket Sc.

Reference is made to FIG. 1B which is a schematic view showing that one end of the conventional thin chip C is stuck on the chamfer Cf due to a friction force. Because the chamfer Cf and the chip C are rigid bodies, there is a friction force between the chamfer Cf and the chip C. The chip C is relatively light, so that the weight of the chip C is insufficient to overcome the friction force. Even if one end of the chip C falls on the chamfer Cf, it is possible that the friction force between the chamfer Cf and the chip C sticks the chip C on the chamfer Cf so that the chip is unable to slide into the chip socket Sc smoothly.

SUMMARY OF THE INVENTION

The main object of the present invention is to provide a chip transfer device capable of floatingly positioning a chip and a method for floatingly positioning a chip, so that a chip can be located in a chip socket completely and firmly before, during, and after a transfer process.

To achieve the above object, the chip transfer device capable of floatingly positioning a chip according to the present invention, which transfers at least one chip from a first position to a second position, mainly comprises a chip carrier, an air pressure switching valve, and a control unit. The chip carrier includes at least one chip socket on an upper surface thereof, and each chip socket is provided with at least one vent hole. The air pressure switching valve includes a first inlet end and an outlet end, wherein the first inlet end is communicated with a positive air pressure source, and the outlet end is communicated with the at least one vent hole of the chip carrier. The control unit is electrically connected to the air pressure switching valve and controls the air pressure switching valve to allow the at least one vent hole to be communicated with the positive air pressure source. When the at least one chip is placed in the at least one chip socket, the control unit controls the air pressure switching valve to allow the at least one vent hole to be communicated with the positive air pressure source, and an air flow which flows through the at least one vent hole from the positive air pressure source blows a lower surface of the at least one chip, so that the at least one chip is air-floated.

As stated above, the present invention allows the chip socket to be communicated with the positive air pressure source, that is, the air flow blows the lower surface of the chip in the chip socket, so that the chip is affected by the air flow to produce a continuous floating phenomenon. Once the air flow is stopped, the chip can completely drop into the chip socket. Accordingly, the present invention uses the air flow to blow the lower surface of the chip so that the chip is air-floated in the chip socket to reduce the chip offset. Once the air flow is stopped, the chip can completely drop into the chip socket to achieve the positioning capability.

In the present invention, the air pressure switching valve further includes a second inlet end, which is communicated with a negative air pressure source. The control unit firstly controls the air pressure switching valve to allow the at least one vent hole to be communicated with the positive air pressure source, and then controls the air pressure switching valve to allow the at least one vent hole to be communicated with the negative air pressure source. In other words, the present invention can perform the floating positioning first, and after the positioning is completed, the negative pressure is used to vacuum suck the chip, so that the chip is firmly fixed in the chip socket.

Furthermore, when the at least one chip is placed in the at least one chip socket with the chip carrier being located at the first position, the control unit can firstly control the air pressure switching valve to allow the at least one vent hole to be communicated with the positive air pressure source, and the control unit then controls the air pressure switching valve to allow the at least one vent hole to be communicated with the negative air pressure source until the chip carrier is moved to the second position. In other words, in the present invention, the chip can be positioned before being transferred, and after the chip is sucked and held by means of the negative pressure source, the chip can be transferred. Accordingly, it can ensure that the chip does not come off during the transfer process of the chip.

On the other hand, in the present invention, the air pressure switching valve can further include a third inlet end, which is communicated with an atmosphere. When the at least one chip is placed in the at least one chip socket with the chip carrier being located at the first position, the control unit controls the air pressure switching valve to allow the at least one vent hole to be communicated with the positive air pressure source, the negative air pressure source, and the atmosphere in sequence, and then the chip carrier is moved to the second position. In other words, in the present invention, the chip can be positioned before being transferred, and no negative pressure is applied during the transfer process, that is, the chip socket is at the atmosphere, allowing the chip to be held in the chip socket by its own weight. Accordingly, there is no need to additionally provide pipes or joints communicated with the positive or negative pressure source on the transfer path of the chip socket and at the second position, so that the overall equipment is more simplified, and costs for assembling the equipment and for maintenance of the equipment can be greatly reduced.

Preferably, the present invention can further include a pressure sensing unit, which is electrically connected to the control unit. When the control unit controls the air pressure switching valve to allow the at least one vent hole to be communicated with the negative air pressure source, the control unit can control the pressure sensing unit to detect air pressure in the chip socket, and the control unit can send a warning or control the air pressure switching valve to allow the at least one vent hole to be communicated with the positive air pressure source again if the air pressure is higher than a predetermined value. That is, when the chip is sucked by negative pressure, the present invention can additionally detect the air pressure in the chip socket through the pressure sensing unit and determine whether the chip has been correctly positioned. If the chip is not correctly positioned, air leakage occurs, causing air pressure rise in the chip socket. In such as case, the control unit can send a warning or allow the chip to be floatingly positioned again.

The at least one vent hole of the chip carrier of the present invention can be funnel-shaped. Each chip socket includes an upper recess portion for receiving the chip and a lower recess portion having a horizontal cross-sectional area smaller than the horizontal cross-sectional area of the upper recess portion. The lower recess portion can be located below the upper recess portion, and the at least one vent hole can be located on the bottom surface of the lower recess portion. The upper recess portion can be gradually expanded toward the upper surface of the chip carrier, and the lower recess portion can also be gradually expanded toward the upper recess portion, and a step portion can be included between the lower recess portion and the upper recess portion. The step portion is provided for placement of the chip, and the opening of the upper recess portion in form of a gradually expanding shape can assist in positioning of the chip.

In order to achieve the above objective, a method for floatingly positioning a chip according to the present invention comprises the steps of: firstly providing a chip to a chip socket, the chip socket being provided on a bottom surface thereof with at least one vent hole, the at least one vent hole being communicated with an outlet end of an air pressure switching valve, the air pressure switching valve further including a first inlet end communicated with a positive air pressure source; and controlling the air pressure switching valve to allow the at least one vent hole to be communicated with the positive air pressure source, a lower surface of the chip being blown by an air flow from the positive air pressure source through the at least one vent hole, so that the chip is air-floated.

According to the method for floatingly positioning a chip provided by the present invention, the vent hole on the bottom surface of the chip socket is firstly communicated with the positive air pressure source to provide the air flow blowing the lower surface of the chip, so that the chip is air-floated by the air flow. Once the air flow is stopped, the chip can completely drop into the chip socket. Accordingly, the method provided by the present invention can ensure that the chip is completely positioned in the chip socket.

The method for floatingly positioning a chip provided by the present invention can further ensure that the chip does not fall out of the chip socket during the transfer process of the chip (i.e., the movement of the chip socket from a first position to a second position). During the movement, negative pressure can be continuously applied to the chip socket to make the chip more stably held in the chip socket. On the other hand, after the chip has been positioned at the first position, no negative pressure is applied so as to simplify the complexity of the equipment and to reduce the cost.

In the method provided by the present invention, when the chip socket is communicated with a negative air pressure source, a pressure sensing unit is used to detect the air pressure in the chip socket. If the chip is not correctly positioned, a large amount of air flows into the chip socket. As a result, the air pressure is higher than a predetermined value, so that the at least one vent hole is communicated with the positive air pressure source again, that is, the chip is floatingly positioned again. Of course, instead of the chip being floatingly positioned again, a warning can be issued.

DESCRIPTION OF THE PREFERRED EMBODIMENTS

FIG. 1A is a schematic view of a conventional thin chip pick-and-place process.

FIG. 1B is a schematic view showing that one end of a conventional thin chip is stuck on a chamfer due to a friction force.

FIG. 2 is a schematic diagram of the first embodiment of the present invention.

FIG. 3 is a schematic view showing transferring of the chips according to the first embodiment of the present invention.

FIG. 4A is a perspective view of a chip carrier of the present invention.

FIG. 4B is a partial cross-sectional view of a chip socket of the present invention.

FIG. 4C is a partial cross-sectional view of the chip socket of the present invention, which shows that a chip is floated in the chip socket by an air flow.

FIG. 5A is a perspective view of another embodiment of the chip socket of the present invention.

FIG. 5B is a partial cross-sectional view of the another embodiment of the chip socket of the present invention.

FIG. 6 is a schematic diagram of the second embodiment of the present invention.

BRIEF DESCRIPTION OF THE DRAWINGS

Before a chip transfer device capable of floatingly positioning a chip and a method for floatingly positioning a chip according to the present invention are described in detail, it should be particularly noted that in the following description, similar components will be designated by the same reference numerals. Furthermore, the drawings of the present invention are merely illustrative, and they are not necessarily drawn to scale. Not all details are necessarily presented in the drawings.

Reference is made to FIGS. 2 and 3 at the same time. As shown in FIG. 3, the chip carrier 2 is movable between a first position $P_1$, where the chips C to be tested are transferred from a chip tray (not shown) to the chip carrier 2 by a pick-and-place device $D_P$, and a second position $P_2$, where the chip C is tested with the test head Th pressed against and in contact with the chip C.

Reference is made to FIGS. 4A and 4B.

Figure 1A:
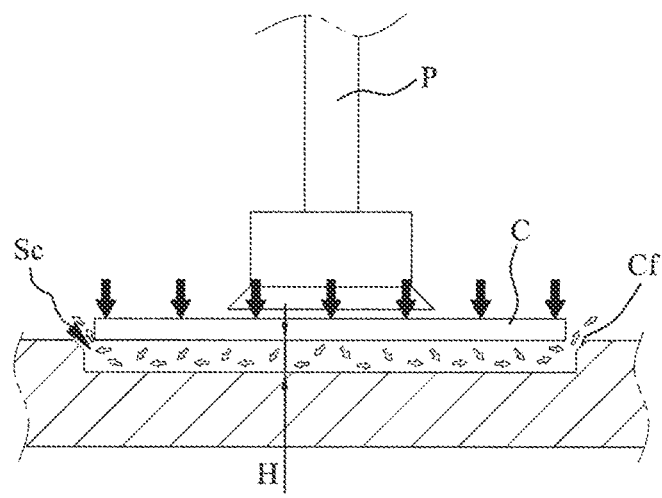
Figure 1B:
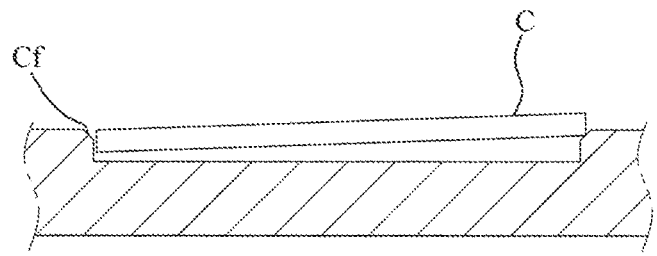
Figure 2:
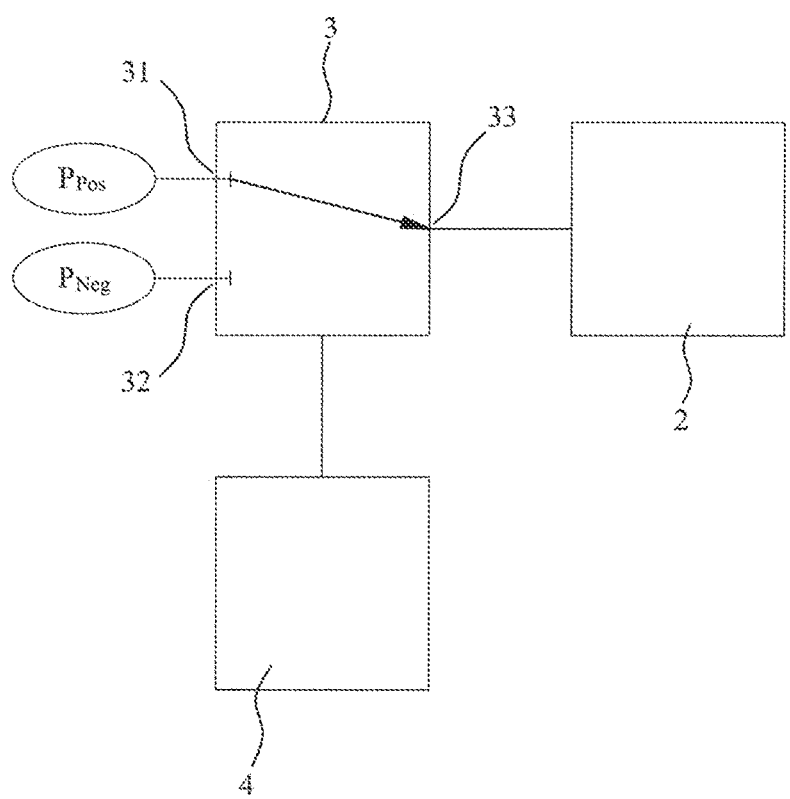
FIG. 2 is a schematic diagram of the first embodiment of the present invention.
Figure 3:
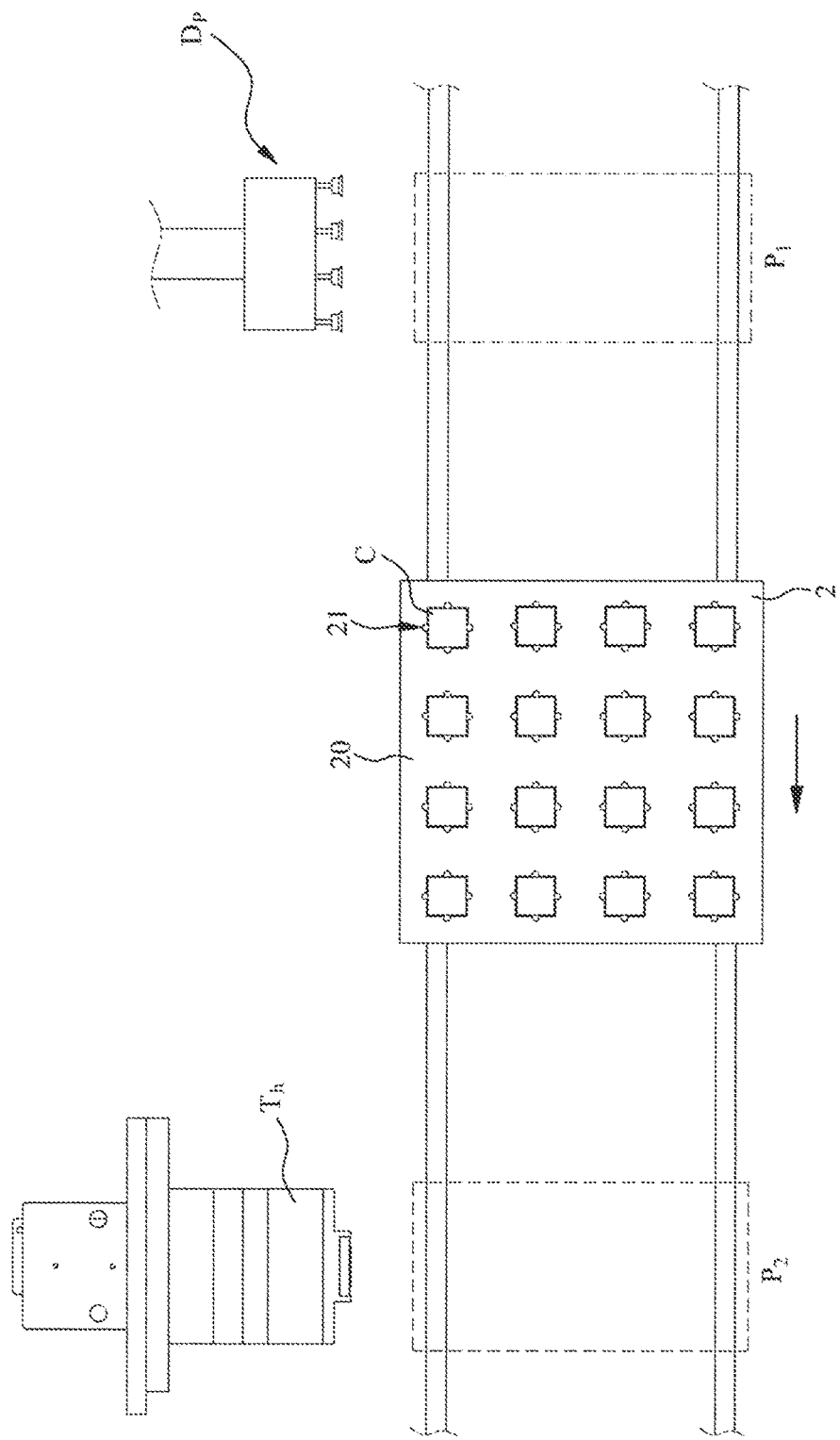
FIG. 3 is a schematic view showing transferring of the first embodiment of the present invention. As shown in the figures, the chip transfer device of the present embodiment mainly comprises a chip carrier 2, an air pressure switching valve 3, and a control unit 4. The chip carrier 2 of the present embodiment can be a shuttle used to transfer chips in a chip inspection equipment.

The upper recess portion 211 of the present embodiment is gradually expanded toward the upper surface 20 of the chip carrier 2, and the lower recess portion 212 is gradually expanded toward the upper recess portion 211, that is to say, the openings of the upper recess portion 212 and the lower recess portion 211 are gradually expanding upward. The openings of the lower recess portion 212 and the upper recess portion 211 in form of gradually expanding shapes facilitate the guiding of an air flow so that the blowing air flow can be evenly spread to the four sides. The gradually expanding shape of the opening of the upper recess portion 211 can further assist in positioning of the chip C, so that the chip C is guided and drops into the upper recess portion 211.

The air pressure switching valve 3 of the present embodiment is a solenoid valve, which includes a first inlet end 31, a second inlet end 32, and an outlet end 33. The first inlet end 31 is communicated with a positive air pressure source $P_{Pos}$, the second inlet end 32 is communicated with a negative air pressure source $P_{Neg}$, and the outlet end 32 is communicated with the vent hole 210 of the chip carrier 2. The control unit 4 of the present embodiment can be an independent programmable logic controller (PLC) or a main controller of the test equipment, which is electrically connected to the air pressure switching valve 3 and controls the air pressure switching valve 3 to allow the vent hole 210 to be communicated with the positive air pressure source $P_{Pos}$ or the negative air pressure source $P_{Neg}$. In other words, the control unit 4 can control the air pressure switching valve 3 to switch the outlet port 33 to be communicated with the first inlet end 31 for blowing the chip or communicated with the second inlet end 32 for sucking the chip.

Figure 4A:
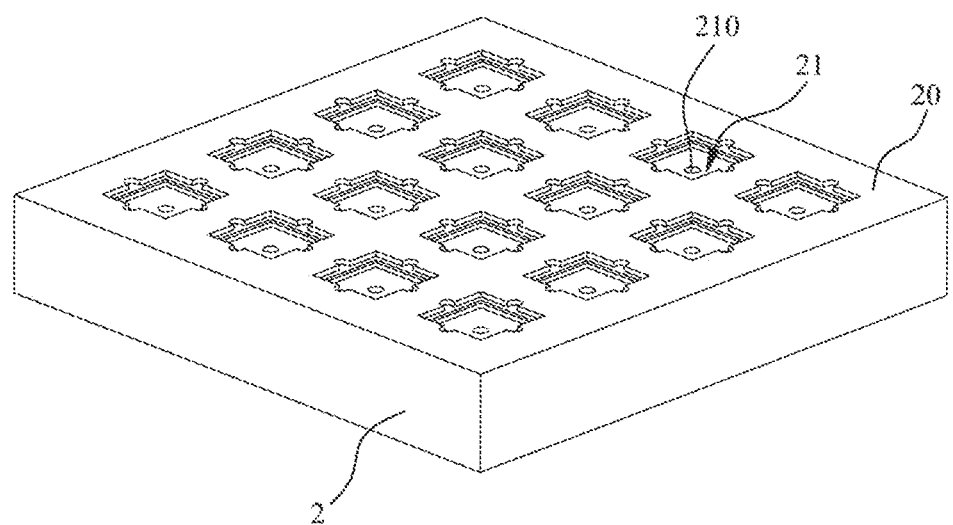
FIG. 4A is a perspective view of the chip carrier of the present invention.
Figure 4B:
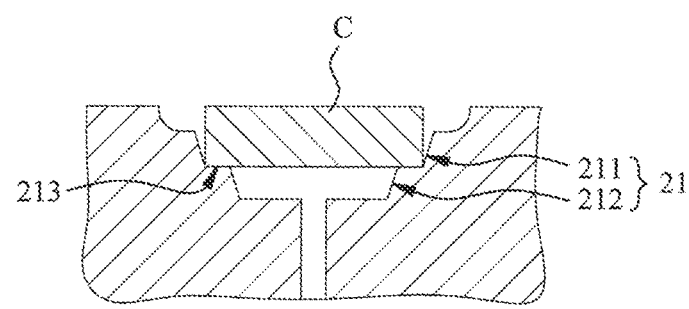
FIG. 4B is a partial cross-sectional view of the chip carrier of the present invention. The chip carrier 2 of the present embodiment is provided on the upper surface 20 with a plurality of chip sockets 21, and each chip socket 21 is provided with a vent hole 210. In the present embodiment, each chip socket 21 includes an upper recess portion 211 for receiving a chip and a lower recess portion 212. The lower recess portion 212 is located below the upper recess portion 211, and the vent hole 210 is formed on the bottom surface of the lower recess portion 212. The horizontal cross-sectional area of the lower recess portion 212 is smaller than the horizontal cross-sectional area of the upper recess portion 211, so that a step portion 213 where the chip C can be placed and supported is formed between the upper recess portion 211 and the lower recess portion 212.
Figure 4C:
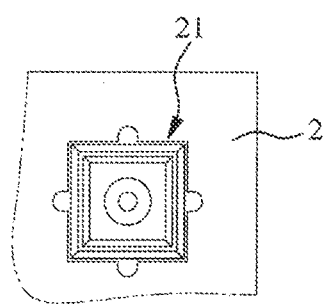

The method of the present embodiment will be described in detail below. When the chip carrier 2 is located at the first position $P_1$, the chip C to be tested is moved from the chip tray (not shown) to a position above the chip socket 21 of the chip carrier 2 by the pick-and-place device $D_p$ and released. Then, the control unit 4 controls the air pressure switching valve 3 to allow the vent hole 210 to be communicated with the positive air pressure source $P_{Pos}$, so the air flow is ejected upward from the vent hole 210 and blows the chip C, thereby causing the chip C to be air-floated and finely moved. Reference is made to FIG. 4C. FIG. 4C is a partial cross-sectional view of the chip socket of the present invention, which shows a floating phenomenon of the chip caused by the air flow in the chip socket.

In particular, in addition to helping the chip C to be centered, as shown in FIG. 4C, the floating effect of the chip C caused by the blowing air flow of this embodiment can eliminate the rigid surface friction force between the chip C and the flared opening (chamfer) of the upper recess portion 211 so as to allow the chip C to slide smoothly and completely into the upper recess portion 211 because the blowing air flow continuously flows out from the four edges of the chip C, and the air flow itself forms an excellent lubricating fluid. For example, the chip C to be transferred in the present embodiment is a CMOS chip, and the pressure the blowing air ranges between 2 kpa and 4 kpa, and the size of the CMOS chip is 7.3 mm×6.5 mm.

Furthermore, after the blowing air flow continues for several seconds, the control unit 4 controls the air pressure switching valve 3 to allow the vent hole 210 to be communicated with the negative air pressure source $P_{Neg}$, thereby generating a negative pressure in the lower recess portion 212 of the chip socket 21 for sucking the chip C. In other words, after a floatingly positioning step, if the blowing air is stopped, the chip C can completely drop into the upper recess portion 211 of the chip socket 21, and then a suction force is generated by the negative air pressure source $P_{Neg}$, so that the chip C is firmly fixed in the chip socket 21. Finally, the chip carrier 2 is controlled to move to the second position $P_2$. During the entire transfer process, the negative air pressure source $P_{Neg}$ is always communicated with the vent hole 210, so the chip C is sucked in the chip socket 21 all the time to ensure that the chip C would not come off.

Figure 5A:
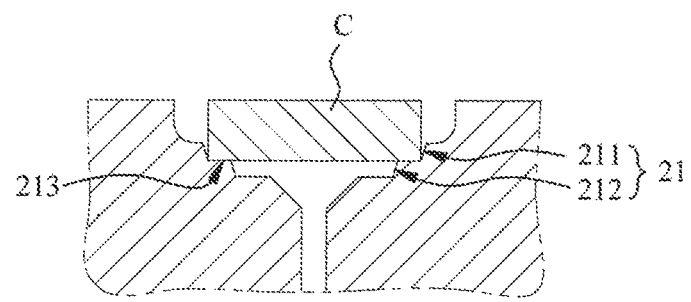
Figure 5B:
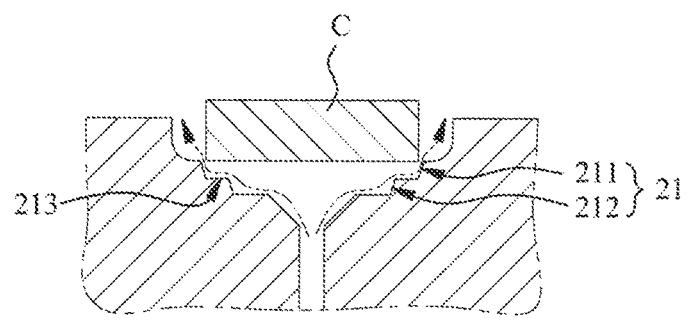

Reference is made to FIGS. 5A and 5B. FIG. 5A is a perspective view of another embodiment of the chip socket 21 of the present invention, and FIG. 5B is a partial cross-sectional view of the another embodiment of the chip socket 21 of the present invention. As shown in the figures, the main difference in the chip socket 21 between the present embodiment and the previous embodiment lies in the form of the vent hole 210. The vent hole 210 of the present embodiment is funnel-shaped for the main purpose of increasing the air pressure at the outlet of the funnel-shaped vent hole 210 and reducing the flow rate, so it can provide a more uniform and smooth blowing effect and prevent the chip C from being swung greatly during the floatingly positioning process.

Figure 6:
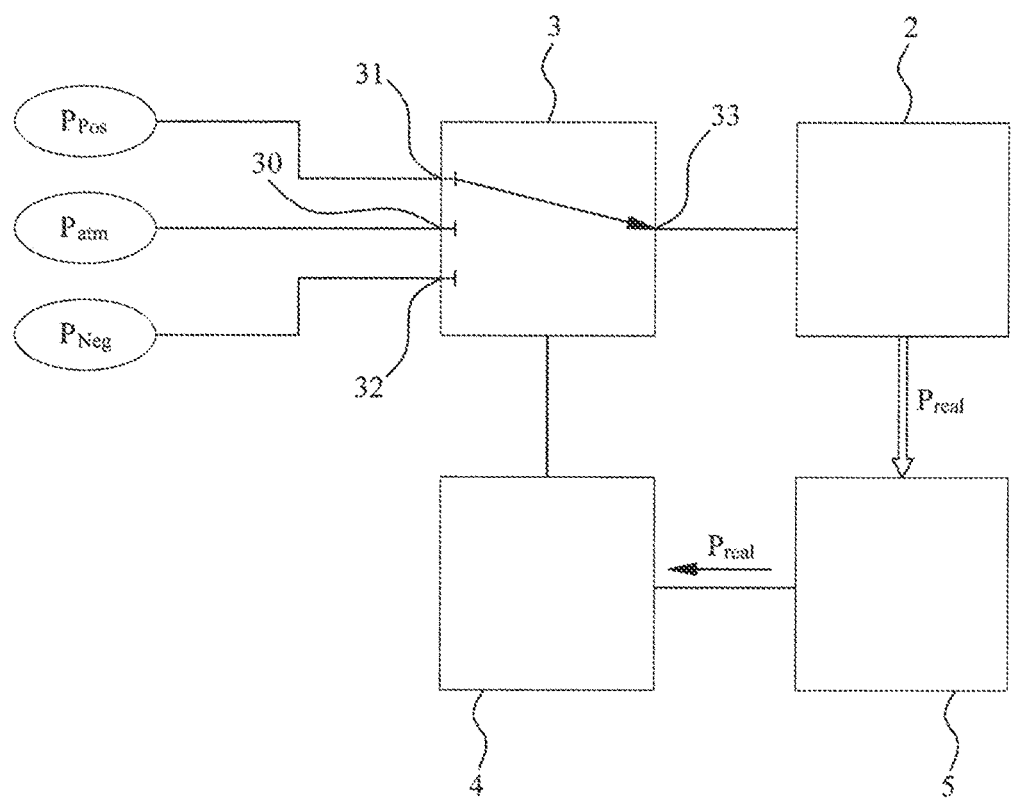

Reference is made to FIG. 6, which is a schematic diagram of the second embodiment of the present invention. The main difference between the second embodiment and the first embodiment lies in that the second embodiment further comprises a pressure sensing unit 5, which is electrically connected to the control unit 4 for detecting the air pressure in the chip socket 21. In addition, the air pressure switching valve 3 of the present embodiment further includes a third inlet port 30, which is communicated with an atmosphere $P_{atm}$.

The operation method of the second embodiment will be described in detail below. First, when the chip carrier 2 is located at the first position $P_1$, the chip C is aligned with the chip socket 21 and then released. Next, the control unit 4 also firstly controls the air pressure switching valve 3 to allow the vent hole 210 to be communicated with the positive air pressure source $P_{Pos}$, so that the chip C is floatingly positioned by the blowing air. Furthermore, the control unit 4 controls the air pressure switching valve 3 to allow the vent hole 210 to be communicated with the negative air pressure source $P_{Neg}$, so that the chip C is firmly fixed in the upper recess portion 211 of the chip socket 21. Then, the control unit 4 controls the air pressure switching valve 3 to allow the vent hole 210 to be communicated with the atmosphere $P_{atm}$, and the chip carrier 2 is moved to the second position $P_2$.

In other words, in the second embodiment, the chip C has been positioned before being transferred, and no negative pressure is forcibly applied during the transfer process. Accordingly, there is no need to additionally provide positive and negative pressure communication pipes or joints on the transfer path of the chip socket 211 and at the second position $P_2$, so that the overall equipment is more simplified, and assembly and maintenance costs can be greatly reduced.

In addition, in the second embodiment, the pressure sensing unit 5 is specially disposed in the chip socket 21. When the control unit 4 controls the air pressure switching valve 3 to allow the vent hole 210 to be communicated with the negative air pressure source $P_{Neg}$, the control unit 4 also controls the pressure sensing unit 5 to detect the air pressure in the chip socket 21. If it is determined by the control unit 4 that the air pressure is higher than a predetermined value, it means that the chip C is not completely placed in the upper recess portion 211 of the chip socket 21. Therefore, there is an air gap between the chip C and the chip socket 21 to cause a large amount of air flowing into the chip socket 211, thereby increasing the pressure of the air flowing inward. It means that the chip is not correctly positioned. At this time, the control unit 4 controls the air pressure switching valve 3 to allow the vent hole 210 to be communicated with the positive air pressure source $P_{Pos}$ again, that is, to floatingly position the chip again. However, in other embodiment of the present invention, a warning such as a sound and light sign or a warning message on a display can be sent by the control unit 4 instead of floatingly positioning the chip C.

In short, in the second embodiment of the present invention, when the chip C is sucked by a negative pressure, the pressure sensing unit 5 can be used to detect the air pressure in the chip socket 21 and determine accordingly whether the chip C has been correctly positioned. If the chip C is not correctly positioned, a large amount of air leakage would occur and cause the air pressure in the chip socket 21 to increase, and the control unit 4 can thereby send a warning or floatingly position the chip C again.

The preferred embodiments of the present invention are illustrative only, and the claimed inventions are not limited to the details disclosed in the drawings and the specification. Accordingly, it is intended that it have the full scope permitted by the language of the following claims.

What is claimed is:

1. A chip transfer device capable of floatingly positioning a chip, which transfers at least one chip from a first position to a second position, the chip transfer device comprising: a chip carrier, including at least one chip socket on an upper surface thereof, and each chip socket being provided with at least one vent hole; an air pressure switching valve, including a first inlet end, a second inlet end and an outlet end, wherein the first inlet end is communicated with a positive air pressure source, the second inlet end is communicated with a negative air pressure source, and the outlet end is communicated with the at least one vent hole of the chip carrier; and a control unit, electrically connected to the air pressure switching valve and controlling the air pressure switching valve to allow the at least one vent hole to be communicated with at least one of the positive air pressure source and the negative air pressure source, wherein when the at least one chip is placed in the at least one chip socket, the control unit controls the air pressure switching valve to allow the at least one vent hole to be communicated with the positive air pressure source, and an air flow which flows through the at least one vent hole from the positive air pressure source blows a lower surface of the at least one chip, so that the at least one chip is air-floated; and then, the control unit controls the air pressure switching valve to allow the at least one vent hole to be communicated with the negative air pressure source.

2. The chip transfer device of claim 1, wherein when the at least one chip is placed in the at least one chip socket with the chip carrier being located at the first position, the control unit firstly controls the air pressure switching valve to allow the at least one vent hole to be communicated with the positive air pressure source, and then controls the air pressure switching valve to allow the at least one vent hole to be communicated with the negative air pressure source until the chip carrier is moved to the second position.

3. The chip transfer device of claim 1, wherein the air pressure switching valve further includes a third inlet end, which is communicated with an atmosphere; when the at least one chip is placed in the at least one chip socket with the chip carrier being located at the first position, the control unit controls the air pressure switching valve to allow the at least one vent hole to be communicated with the positive air pressure source, the negative air pressure source and the atmosphere in sequence, and then the chip carrier is moved to the second position.

4. The chip transfer device of claim 1, further comprising a pressure sensing unit, which is electrically connected to the control unit, wherein when the control unit controls the air pressure switching valve to allow the at least one vent hole to be communicated with the negative air pressure source, the control unit controls the pressure sensing unit to detect air pressure in the chip socket, and the control unit sends a warning or controls the air pressure switching valve to allow the at least one vent hole to be communicated with the positive air pressure source again if the air pressure is higher than a predetermined value.

5. The chip transfer device of claim 1, wherein each chip socket includes an upper recess portion for receiving the chip and a lower recess portion having a horizontal cross-sectional area smaller than a horizontal cross-sectional area of the upper recess portion, the lower recess portion is located below the upper recess portion, and the at least one vent hole is located on a bottom surface of the lower recess portion.

6. A method for floatingly positioning a chip, comprising the steps of: (A) providing a chip to a chip socket, a bottom surface of the chip socket being provided with at least one vent hole, the at least one vent hole communicated with an outlet end of an air pressure switching valve, the air pressure switching valve further including a first inlet end communicated with a positive air pressure source; and (B) controlling the air pressure switching valve to allow the at least one vent hole to be communicated with the positive air pressure source, a lower surface of the chip being blown by an air flow from the positive air pressure source through the at least one vent hole, so that the chip is air-floated.

7. The method of claim 6, wherein the air pressure switching valve further includes a second inlet end communicated with a negative air pressure source; the method further comprises a step (C) of controlling the air pressure switching valve to allow the at least one vent hole to be communicated with the negative air pressure source; in the steps (A), (B) and (C), the chip socket is located at a first position; in the step (C), the air pressure switching valve continuously allows the at least one vent hole to be communicated with the negative air pressure source until the chip socket is located at a second position.

8. The method of claim 7, wherein in the step (C), a pressure sensing unit is provided to detect air pressure in the chip socket, and the step (B) is performed repeatedly if the air pressure is higher than a predetermined value.

9. The method of claim 6, wherein the air pressure switching valve further includes a second inlet end communicated with a negative air pressure source and a third inlet end communicated with an atmosphere; the method further comprises a step (C) of controlling the air pressure switching valve to allow the at least one vent hole to be communicated with the negative air pressure source; in the steps (A), (B) and (C), the chip socket is located at a first position; after the step (C), the method further comprises a step (D) of controlling the air pressure switching valve to allow the at least one vent hole to be communicated with the atmosphere until the chip socket is located at a second position.

\* \* \* \* \*